United States Patent

Wolf et al.

[11] 4,123,661
[45] Oct. 31, 1978

[54] CONTRAST ENHANCEMENT OF ELECTRON BEAM ALIGNMENT MARKS

[75] Inventors: Edward D. Wolf, Northridge; Walter E. Perkins, Jr., Woodland Hills, both of Calif.

[73] Assignee: Hughes Aircraft Company, Culver City, Calif.

[21] Appl. No.: 785,801

[22] Filed: Apr. 8, 1977

Related U.S. Application Data

[63] Continuation-in-part of Ser. No. 601,943, Aug. 4, 1975, abandoned.

[51] Int. Cl.$^2$ ............................................. H01J 37/00
[52] U.S. Cl. ................................................ 250/492 A
[58] Field of Search ..................... 250/492 A, 397, 398

[56] References Cited

U.S. PATENT DOCUMENTS 3,875,414   4/1975   Prior ................................ 250/492 A

OTHER PUBLICATIONS

"Electron Beam & Ion Beam Fabricated Microwave Switch," Wolf et al., IEEE Trans. on Electron Devices, vol. ED-17, No. 6, Jun. 1970, pp. 446-449.
"Automatic Pattern Positioning of Scanning Electron Beam Exposure," Miyauchi et al., IEEE Trans. on Electron Dev., vol. ED-17, No. 6, pp. 450-457.
"High-Resolution Electron-Beam Fabrication," Hatzakig et al., 10th Symp. on Elect., Ion and Laser Beam Tech., May 1969, pp. 107-114.

*Primary Examiner*—Bruce C. Anderson
*Attorney, Agent, or Firm*—Lewis B. Sternfels; W. H. MacAllister

[57] ABSTRACT

High atomic number metals or compounds are used as electron beam registration alignment marks on low atomic number substrates; this combination produces enhanced secondary and backscattered electron video signals over topographical alignment marks of homogeneous materials. To augment the enhanced signal contrast, pairs of alignment marks are placed very close together (less than or equal to 3 micrometers), from which the gap between the pair produces the augmented, enhanced signal contrast. In particular, the backscattered electron signal is enhanced when detected with an energy sensitive collector such as a silicon diode detector.

10 Claims, 7 Drawing Figures

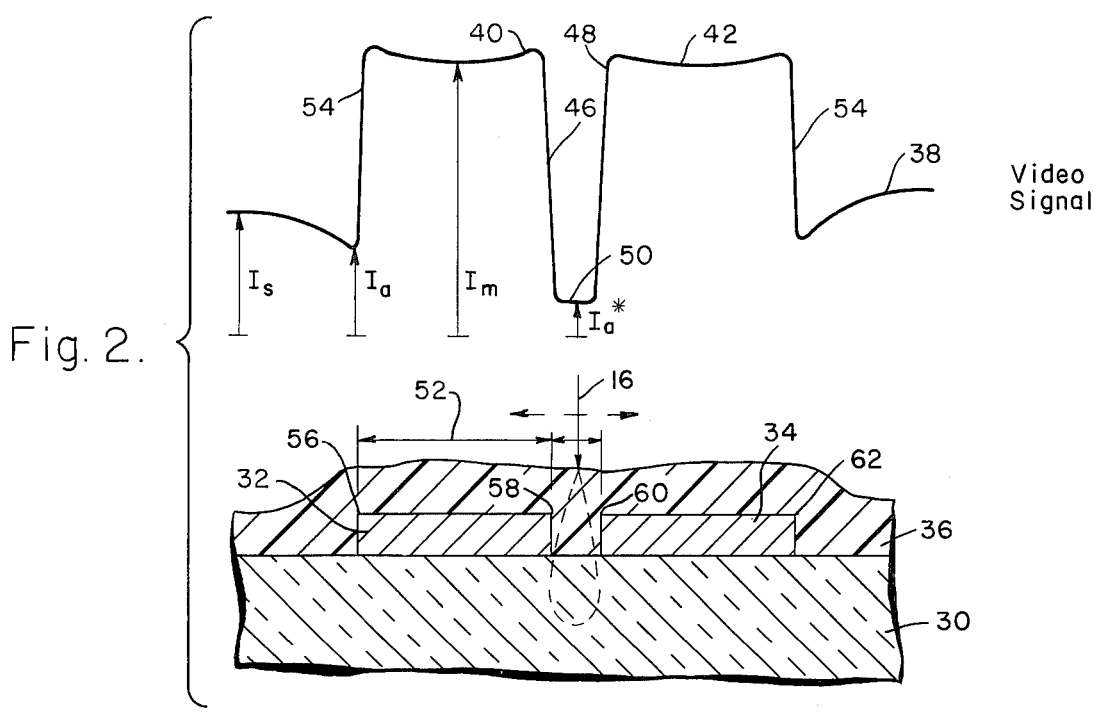
Fig. 2.
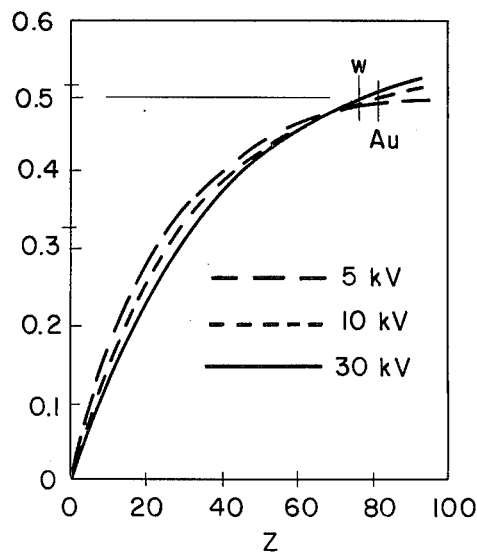
Fig. 4.
Fig. 3.
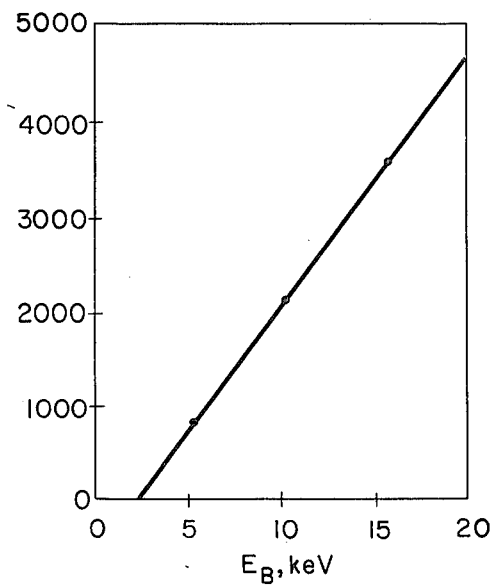
$I_D/I_B$
Fig. 5.

CONTRAST ENHANCEMENT OF ELECTRON BEAM ALIGNMENT MARKS

CROSS-REFERENCE TO RELATED APPLICATIONS

This is a continuation-in-part of copending patent application, Ser. No. 601,943, filed Aug. 4, 1975, abandoned.

Reference is directed to copending patent application Ser. No. 601,944, entitled "Means and Method for Electron Beam Precision Alignment" by Edward D. Wolf, abandoned, also published in the *Journal of Vacuum Science and Technology*, Volume 12, No. 6, Nov./Dec. 1975, pages 1266-1270.

BACKGROUND OF THE INVENTION

1. Field of the Invention

The present invention relates to means and method for providing augmented, enhanced contrast of electron video signals of alignment marks with respect to microcircuit substrates and coatings thereon.

2. Description of the Prior Art

Direct wafer electron beam lithography requires re-registration of patterned fields to substrate fields. For very high resolution devices and circuits with line widths as narrow as 0.5 microns, the re-registration must be accurate to better than 0.1 microns. This level of precision demands very accurate scanning electron microscopy detection of the alignment marks, generally as a line scan, and fast positional control feedback by means of a digital computer. In the past, such registration has been based on topographical changes which modulate the secondary electron emission which, when directly viewed without layers thereon, produces acceptable contrast of the video signals. However, upon the application of a layer of resist, for example, poor contrast of the video signal results because the resist tends to smooth the sharp steps or edges of the underlying surface, such as formed by an oxide cut. Therefore, the video signal-to-noise ratio from secondary electrons is insufficiently large to provide the required video signal contrast.

As taught in the above-referenced copending patent application Ser. No. 601,944, which overcomes these and other problems, by utilizing high atomic number metals or compounds as electron beam registration aligmnment marks on low atomic number substrates, improved secondary and backscattered electron video signals are obtained.

SUMMARY OF THE INVENTION

The present invention comprises an improvement and refinement of the invention described in above-identified copending patent application Ser. No. 601,944 by providing for a geometric arrangement of the electron beam alignment mark described therein by placing two of such alignment marks very close together (e.g. <3μm) so that their edges enhance the fundamental signal contrast detected.

It is, therefore, an object of the present invention to provide means and method for producing augmented, enhanced contrast of backscattered electron video signals.

Another object of the present invention is to permit the use of signal-to-noise signals which are higher than that previously used.

Another object of the present invention is to provide for the use of increased thicknesses of electron beam resist films.

Other aims and objects as well as a more complete understanding of the present invention will appear from the following explanation of exemplary embodiments and the accompanying drawings thereof.

BRIEF DESCRIPTION OF THE DRAWINGS

FIG. 2 illustrates the use of the present invention for obtaining augmented high contrast of backscattered electron emission from a substrate;

FIG. 3 illustrates one configuration of alignment marks placed in corners of the exposure field on a substrate useful, for example, in the manufacture, with the use of one or more masks, or a semiconductor wafer having electronic devices therein into an electronic system for providing an integrated electronic function;

FIG. 4 depicts a plot of backscattered electron coefficient ($\eta$) versus atomic number (Z);

FIG. 5 is a graph of the ratio of detector current and beam current ($I_D/I_B$) versus electron beam voltage ($E_B$)

DESCRIPTION OF THE PREFERRED EMBODIMENT

Technology useful in the practice of the present invention has been described in a presentation and publication at the Thirteenth Symposium on Electron Ion and Photon Beam Technology, Colorado Springs, Colo., May 22, 1975, and the information and data contained in this presentation and publication thereof is incorporated in this specification as if set forth in haec verba. The Symposium proceedings have been published in the *Journal of Vacuum Science and Technology*, Volume 12, No. 6, Nov./Dec. 1975, pages 1266-1270.

Figure 1A:
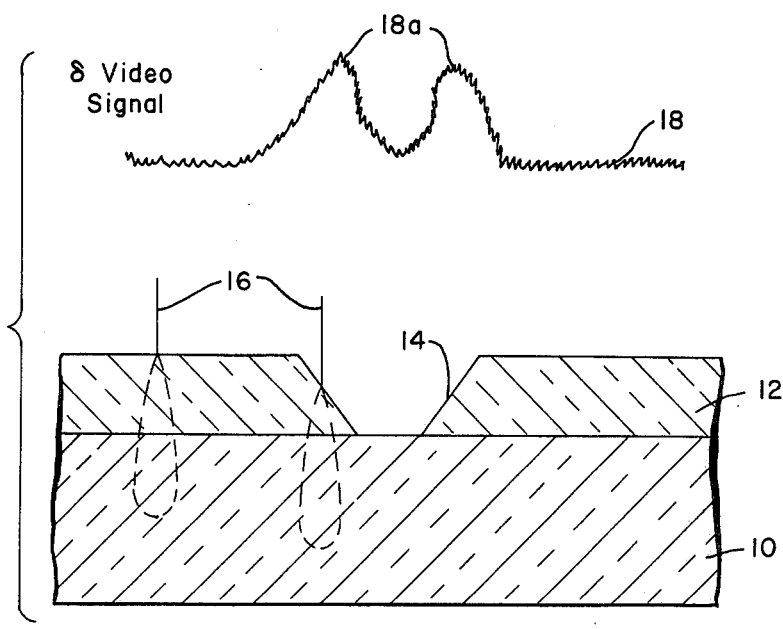
FIGS. 1a and 1b depict the prior art utilizing topographical changes which modulate the secondary electron emission, respectively in silicon substrates with silicon oxide thereon before and after resist has been applied thereto.
Figure 1B:
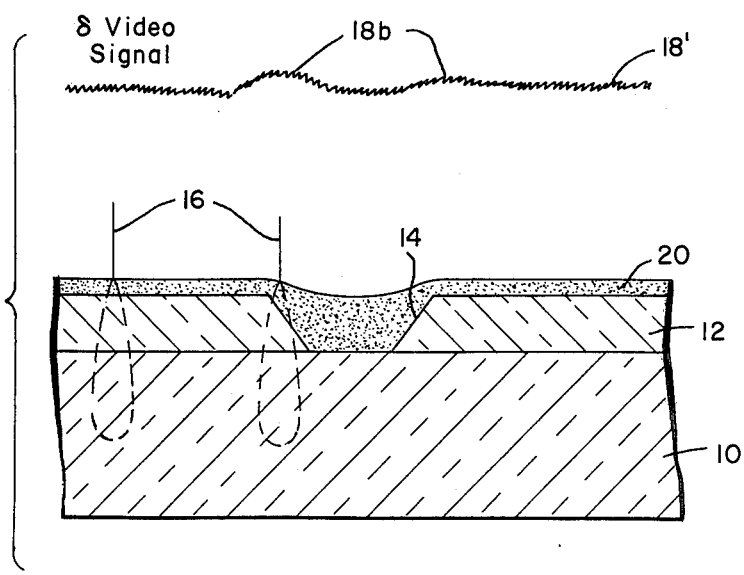

In order to provide for a better understanding and background of the present invention, it will be useful to describe and discuss briefly the prior art and some of its resulting problems, in conjunction with FIGS. 1a and 1b. In both figures, a silicon substrate 10, having the usual electronic devices placed therein by conventional techniques, have a silicon oxide layer 12 thereon with opening means, such as vias 14, to expose the contact pads of the devices within substrate 10. Without further processing, as shown in FIG. 1a, when an electron beam, such as represented by lines 16, is directed at insulating layer 12 and substrate 10, the video signal obtained therefrom, as represented by curve 18, shows distinct differences in the topography of the substrate with oxide layer thereon, the change of topography being displayed in video signal 18 as peaks 18a. Such peaks 18a have a height of sufficient magnitude so as to permit the change of topography to be readily recognized.

However, if an electron resist 20, such as shown in FIG. 1b, is placed over oxide layer 12, it substantially smooths out the topography so that the video signal ($\delta$) 18' produces substantially smaller peaks 18b, as compared to the much larger peaks 18a of FIG. 1a. Such small peaks 18b, when compared with the remainder of the video signal, are generally insufficient to permit the worker to readily distinguish with any degree of precision the topographical changes on the substrate having an electron resist 20 thereon.

The differences in signal-to-noise contrast vis-a-vis the present invention are discussed hereinafter.

The present invention, as depicted in FIG. 2, avoids this problem, particularly when an electron resist is placed above a substrate. Specifically, FIG. 2 shows a substrate 30 which, like substrate 10 of FIGS. 1a and 1b, has electronic devices therein, and manufactured by conventional prior art techniques. Above the substrate may be an insulating layer, for example, of silicon dioxide. For purposes of describing the present invention, however, such an insulating layer will not be used. On substrate 30 is a pair of alignment marks 32 and 34 which may be of any suitable configuration. Above alignment mark 34 is, for example, a photoresist 36. It is important in the practice of the present invention that alignment marks 32 and 34 have a substantially higher atomic number (Z) than that of substrate 30 and resist 36, in order to produce a highly contrasting video signal 38, having steeply sided peaks 40 and 42. For example, for use on substrate materials of low atomic numbers (Z), such as silicon, gallium arsenide, germanium, and all other conventional substrates, alignment marks 32 and 34 are made of a high atomic number material, such as tantalum, tungsten, rhenium, osmium, iridium, platinum, gold and thallium.

As stated above, the alignment marks need not be specifically restricted to a foreign material but may be part of a device, wherein a pair of conductors on the surface of a substrate may have a sufficiently different atomic number than that of the substrate. Most usually, however, the alignment marks are made specially for alignment purposes, such as at the corners of the device, as shown in FIG. 3. These alignment marks are preferably deposited on a substrate at the earliest possible time. For example, the first step of fabrication may be the growth of a field oxide. The second step would then be to define the alignment marks which can be placed thereon by any suitable means, such as by electron beam lithography with a subtractive or additive step.

Registration marks 32 and 34 are placed sufficiently close together so that the separation 44 therebetween will provide sharply definable maximum dip and rise slopes 46 and 48, respectively, in video signals 40 and 42 or vice-versa, depending on the scan direction of electron beam 16, the maximum dip and rise occurring when the video signal bottoms out therebetween at 50. This bottoming out is defined by the spacing between alignment marks 32 and 34.

The resultant enhanced contrast arises from three principal effects. First the high energy backscattered electrons from the high atomic number mark are peaked in their energy distribution more toward the primary energy than from silicon and hence each electron produces a much larger signal in an energy sensitive detector. Secondly, there are many more electrons backscattered from high atomic number materials (e.g., tantalum) than from low atomic number materials (e.g., silicon). Thirdly, the reduction in gap width down to the beam diameter restricts the number of backscattered electrons that can reach the detector. So the combination of maximum signal from the high atomic number material and the minimum signal from the gap produce the contrast enchancement.

As shown in FIG. 2, the contrast, C, near the edge is very high, as distinguished away from the edge, according to the relationship:

$$C = (I_m - I_s)/I_s$$

when spaced from the registration mark, and $$C_m = (I_m - I_a)/I_a$$

when adjacent to the registration mark. In the present invention contrast C* is even higher because the measurement is between slopes 46 and 48, as follows:

$$C^* = (I_m - I_a^*)/I_a^*;$$

thus, $C^* > C_m > C$ in which each contrast is dependent upon the value of the signal strength, respectively measured away from both registration marks ($I_s$), adjacent the outer edges of the registration marks ($I_a$), or between the registration marks ($I_a^*$). In actual examples, the video signal of a prior art device without resist, such as shown in FIG. 1a, produced a signal strength at substantially flat portions away from via openings of $2.76 \times 10^{-8}$ amperes while the small peak at the opening was approximately $2.80 \times 10^{-8}$ amperes, to provide a contrast of 1.45%. For the case without resist described by $C_m$, the signal strength ($I_s$) away from registration mark 34 was $2.96 \times 10^{-8}$ amperes while the peak strength ($I_m$) measured at $6.65 \times 10^{-8}$ amperes, provide a contrast of 125%. Therefore, the use of high atomic number marks provided a contrast of approximately 100 times greater than the prior art using silicon dioxide, with respect to the surface having no resist material thereon. When a resist is applied, the signal strength ($I_s$) away from the alignment mark was $2.82 \times 10^{-8}$ amperes while the alignment mark signal strength provided a strength ($I_m$) of $5.44 \times 10^{-8}$ amperes, or a resultant contrast of 93%. No appreciable contrast was obtained from the prior art methods as shown in FIG. 1b, when a resist was used. Therefore, even though the resist diminished the contrast slightly from 125% to 93% in the present invention, a significantly high contrast still resulted.

Figure 6:
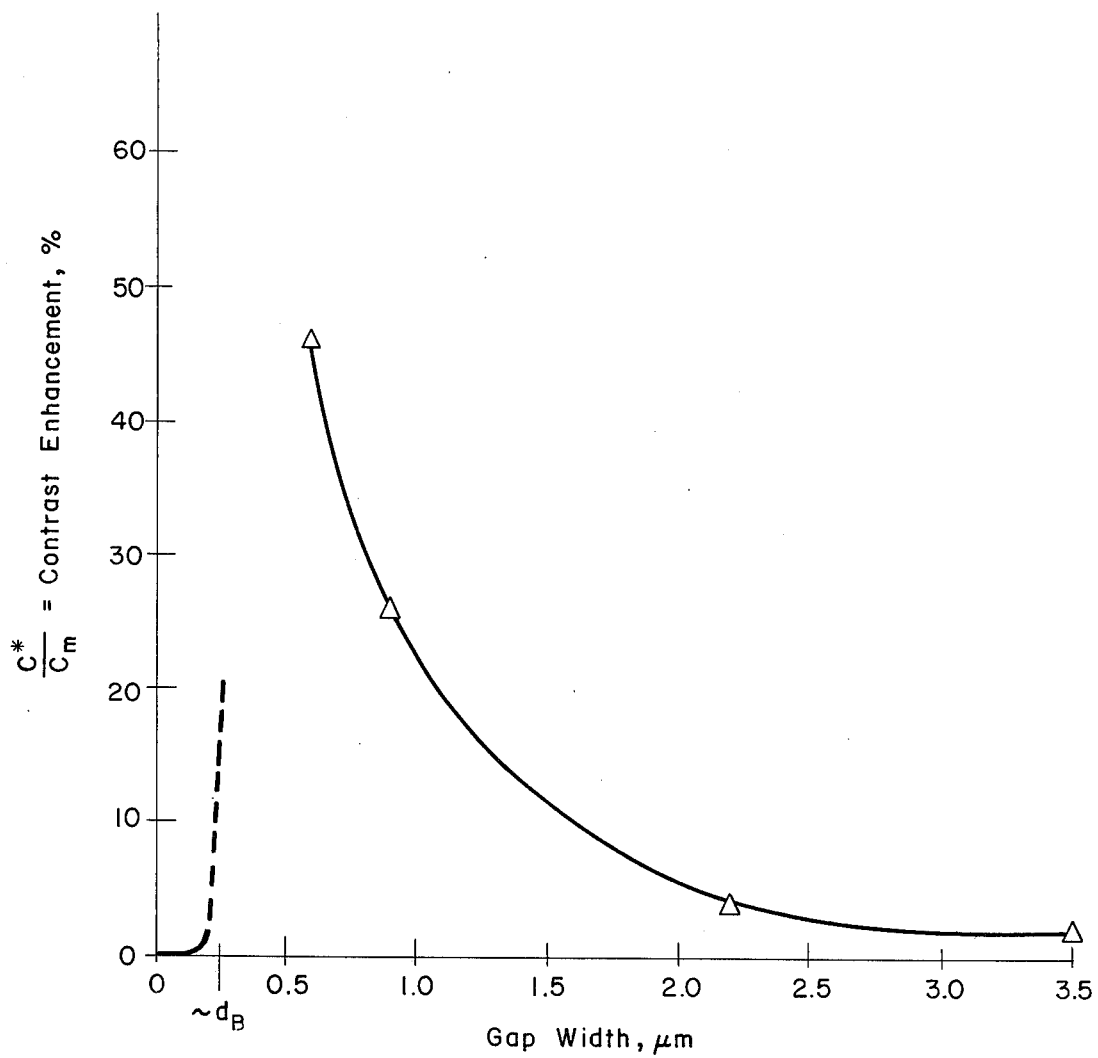
FIG. 6 is a plot of signal contrast enhancement as a function of gap width (e.g., 2000 A tantalum on silicon and 20 keV electron beam).

In the present invention with electron resist the augmented contrast over and above the values discussed above are plotted in FIG. 6 as a function of the alignment mark gap. Note that the contrast augmentation is approaching 50% with gaps as narrow as 0.6μm. This improvement continues until the gap becomes as narrow as the beam diameter at which point the contrast will decrease with further reduction of the gap. Utility of this invention is best when the gap is about 1.5 to 2.0 times the electron beam diameter which showed less than 1μm in diameter.

In obtaining the video signal, the only limitation in the present invention is that there be sufficient electron beam energy to provide penetration of the resist and subsequent return of the low loss electron to the detector. Preferably, electron beam energy of 20 kiloelectron-volts is sufficient. Also, the alignment mark separation gap must be less than the range of the primary electron in the substrate.

Further explanation of the present invention is shown in FIGS. 4 and 5 in which the relationship of the secondary electron yield η versus atomic number Z for different electron beam energies of 5, 10 and 30 kiloelectron-volts discloses that, as the atomic number rises, the secondary electron yield also rises. In FIG. 5, the ratio of detector current to electron beam current is plotted against the voltage of the electron beam and again shows a rising value of current ratios as the electron beam energy rises.

Detection of the backscattered electrons may be obtained by any conventional detectors, such as nuclear diode detectors or radiation diode detectors, which have been optimized for a low-loss backscattered electron detection, or by the method described in "Coates-Kikuchi Patterns and Electron-Spectroscopy from Single Crystals" by E. D. Wolf and P. J. Coane, *Journal of Vacuum Science & Technology*, November/December 1973, Vol. 10, No. 6, pp 1064–1067.

While the preferred utility of the present invention relates to enhanced secondary and backscattered electrons due to the presence of a high atomic number element on a low atomic number substrate, other such "fingerprint" signals are obtainable from alignment marks whose chemical composition is different from the substrate, such as by characteristic x-rays, Auger electrons, and cathodoluminescence, any one of which is unable to position the electron beam after suitable detection and signal processing.

Although the invention has been described with reference to a particular embodiment thereof, it should be realized that various changes and modifications may be made therein without departing from the spirit and scope of the invention.

What is claimed is:

1. Instrumentality for obtaining alignment in fabricating microcircuit devices including:
a microcircuit workpiece and means permanently placed thereon for defining a pair of alignment marks, said workpiece comprising matter whose atomic number is lower than that of said alignment marks means for enhancing contrast therebetween of backscattered electron video signals obtained from directing an electron beam at said workpiece, and said alignment marks means having a close spacing from one another for augmenting the enhanced contrast as a direct result of the close spacing between said alignment marks means.

2. Instrumentality as in claim 1 wherein said close spacing is less than or equal to 3 micrometers.

3. Instrumentality as in claim 2 wherein said workpiece comprises a substrate.

4. Instrumentality as in claim 3 further comprising marking material on said substrate and over said alignment marks means.

5. Instrumentality as in claim 2 wherein said workpiece is selected from the group consisting of silicon, gallium arsenide and germanium and said alignment marks are selected from the group consisting of tantalum, tungsten, rhenium, osmium, iridium, platinum, gold and thallium for providing the contrast.

6. Instrumentality as in claim 2 wherein said workpiece comprises a doped silicon substrate and said alignment marks comprise iridium thereon, and further including respective layers of silicon dioxide and aluminum on and over said substrate and said iridium.

7. Instrumentality as in claim 2 wherein said workpiece comprises a low atomic number substrate and said alignment marks comprise a higher atomic number metal or compound for producing enhanced backscattered video signals.

8. A method for obtaining alignment for fabricating microcircuit devices comprising the steps of providing means permanently placed on a microcircuit workpiece for defining a pair of alignment marks of atomic number higher than that of the workpiece, closely spacing the alignment marks one from the other, directing an electron beam at the workpiece and the alignment marks for obtaining secondary and backscattered electrons therefrom, and converting the secondary and backscattered electrons into observable signals, the difference between the atomic number of the workpiece and the alignment marks being sufficient for enhancing augmented contrast between the signals, and the close spacing between the alignment marks increasing the enhanced contrast.

9. A method as in claim 8 in which the close spacing is less than or equal to 3 micrometers.

10. A method for enhancing contrast of backscattered electrons from a microcircuit substrate and a pair of alignment marks permanently placed thereon comprising the steps of using materials respectively having low and high atomic numbers for the substrate and the alignment marks, respectively for enhancing video signals from the backscattered electrons, and closely spacing said alignment marks from one another with a gap of $\leq$ 3$\mu$m for augmenting the enhanced contrast and suppressed video signals.

* * * * *